United States Patent [19]

Basse et al.

[11] 3,710,274

[45] Jan. 9, 1973

[54] FREQUENCY CONTROL OF OSCILLATORS USING DIGITAL TECHNIQUES

[75] Inventors: Philip Basse, Freeport; Frank J. Sposato, Huntington, both of N.Y.

[73] Assignee: Logimetrics, Incorporated, Greenvale, N.Y.

[22] Filed: April 12, 1971

[21] Appl. No.: 133,111

[52] U.S. Cl.........................331/1 A, 331/14, 331/16, 331/17, 331/18, 331/25

[51] Int. Cl...............................................H03b 3/04

[58] Field of Search.........331/1 A, 14, 16, 17, 18, 25

[56] References Cited

UNITED STATES PATENTS 3,555,446 1/1971 Braymer..............................331/1 A
3,504,294 3/1970 Martin, Jr............................331/1 A
3,488,605 1/1970 Schwartz..............................331/17

*Primary Examiner*—John Kominski
*Assistant Examiner*—Siegfried H. Grimm
*Attorney*—Arthur L. Plevy

[57] ABSTRACT

Frequency control apparatus for an oscillator includes a first up-counter and a down-counter. A number representative of an oscillator's frequency is stored in the first counter during a given interval and then transferred to said down-counter. The down-counter is then caused to count down said frequency during the same interval. At the termination of this interval, the down-counter has stored therein a count manifesting the variation of the oscillator's frequency, which count is detected and processed to provide a control signal used to vary the oscillator's frequency in a direction to tend to cause the down-counter to indicate all zeroes at the end of said interval.

14 Claims, 3 Drawing Figures

INVENTORS
PHILIP BASSE &
FRANK J. SPOSATO

INVENTORS
PHILIP BASSE &
FRANK J. SPOSATO

FREQUENCY CONTROL OF OSCILLATORS USING DIGITAL TECHNIQUES

BACKGROUND OF THE INVENTION

This invention relates to frequency control circuits and more particularly to such control circuits utilizing digital techniques.

The art of frequency control has long been investigated and implemented by a plurality of techniques.

Basically, the object of any such control system is to develop an error signal determinative of the departure of the frequency of an oscillator from a predetermined or desired value. This error signal is then utilized, in conjunction with a variable reactant element, to control or set the frequency of the oscillator to that desired value.

To accomplish such control, many different approaches have been implemented by the prior art.

There presently exists equipment as signal generators which are capable of providing a wide-range of frequency signals, used for test purposes or otherwise.

Certain of these generators conveniently include display devices, which by means of suitable digital circuitry provide the user with a visual readout of the frequency that the signal generator is operating at. An example of such an apparatus is shown by reference to U.S. Pat. No. 3,509,484 entitled "DIGITAL FREQUENCY COUNTING AND DISPLAY APPARATUS FOR TUNABLE WIDE BAND SIGNAL GENERATORS", issued on Apr. 28, 1970 by Philip Basse and assigned to the Slant/Fin Corporation.

Such an apparatus utilizes controlled timing gates and digital counter arrangements to provide a visual display representative of the actual frequency provided by the generator.

Pursuant to such concepts, there exists additional teachings on utilizing such digital counters and gates to provide an error signal for the oscillator circuitry in such generators, to control frequency.

For an example of such a system, reference is made to U.S. Pat. No. 3,488,605 entitled "OSCILLATOR WITH DIGITAL COUNTER FREQUENCY CONTROL CIRCUITS" and issued on Jan. 6, 1970 to Edmund I. Schwartz.

In such techniques, certain digits determinative of the oscillator's frequency are pre-set to a desired value. Once such a presetting is implemented by the operator, he is assurred that the signal generator will operate to provide the pre-set frequency.

Such techniques offer great advantage in permitting the operator to determine the generator's frequency and assuring him that this frequency will be maintained.

However, these techniques require a separate switch for each digit to be controlled and set.

For example, in such systems, the counter display may provide information in regard to the first three or four digits indicative of frequency. Hence, such a display may, for example, indicate 100KHz. This, of course, represents a frequency of 100,000Hz. It is apparent that the three lower digits not displayed may be within the range of 000–999. Therefore, the operator is only assured that the frequency he is tuned to is accurrate to the displayed places. He cannot know whether he is tuned to 100,000Hz or 100,999Hz or at some other frequency between these two values.

According to the teachings as incorporated and provided by U.S. Pat. No. 3,488,605, the operator is provided with a series of switches which he can set to determine the unseen digits. Hence, by setting these switches, he is fully apprised of the frequency in regard to all six places.

Another technique which may be used to allow an operator to ascertain the unknown digits is accomplished by an expansion of the interval associated with the timing gate coupled to the counter. For example, if one utilized a one second gate, frequency would be read directly. That is, in one second, for a frequency of 100,500Hz, 100,500 pulses would enter the counter. The higher three stages of such a counter would contain the digits 100 therein, the lower three stages would therefore contain the digits 500. However, for economical reasons and so on, these digits would not be displayed and hence the operator does not know what these digits are, without further control means. But now assume that the six stage counter were enabled for 10 seconds. This would therefore cause (10 × 100,500) or 1,000,500 pulses to enter this counter. Therefore, the lower three digits of the display would read, at the end of this 10 second period, 005. Hence, the operator knows that the fourth digit of frequency is 5. If the counter gate were expanded by an additional factor of 10, the three digit display would read 050. Therefore, he knows the value of the fourth and fifth. Still another expansion of 10 or an increase to 1,000 seconds causes the display to read 500, thereby representing the fourth, fifth and sixth digits.

It is understood that the above explanations and values were chosen in order to simplify the problem and in practice, and as further explained in the above references, various other counter gate durations based on binary numbers and so on may be selected to provide the appropriate display in much shorter intervals.

It can also be seen from the above explanation that no matter what the original counter gate duration is, to expand the display one has to increase this duration by a factor of 10 for each digit not displayed.

This therefore increases the display time. Furthermore, without the addition of control circuitry, the operator would frequently activate the circuitry to increase the gate time in order to assure himself that the frequency (all six digits, for example) is maintained.

This therefore occupies the operator's time, while further increasing the display time.

Of course, with a control circuit such as shown in U.S. Pat. No. 3,488,605, the switch settings with the error signal and oscillator control circuits alleviates this problem. However, additional switches are required to pre-set the counter at the desired digits. These are expensive and for many purposes, are not really necessary as a user for certain applications may not particularly care what the frequency is in regard to the least significant digits.

There are many instances where this is true, as in testing certain filters, I.F. amplifier responses and so on. A user may be concerned with using a frequency with the bandpass of the circuit to be tested. In such cases, however, the operator would require that the frequency of the generator remain relatively stable within predetermined limits for the entire test interval.

It is therefore an object of this invention to provide an improved frequency control system for use with a signal generator utilizing digital control techniques to assure that the frequency of a signal generator remains relatively constant within predetermined limits as initially set.

BRIEF DESCRIPTION OF THE PREFERRED EMBODIMENT

These and other objects of the present invention are accomplished by a counter responsive to the frequency of an oscillator for storing therein a number indicative of said frequency during a given interval. Second means responsive to the number stored operate to compare the frequency of the oscillator for the exact time interval at a second time. Means are responsive to any difference in frequency between the oscillator signal as originally stored and that signal developed at said second time to vary the frequency of the oscillator in a direction towards the first number.

DETAILED DESCRIPTION OF THE FIGURES

Figure 1:
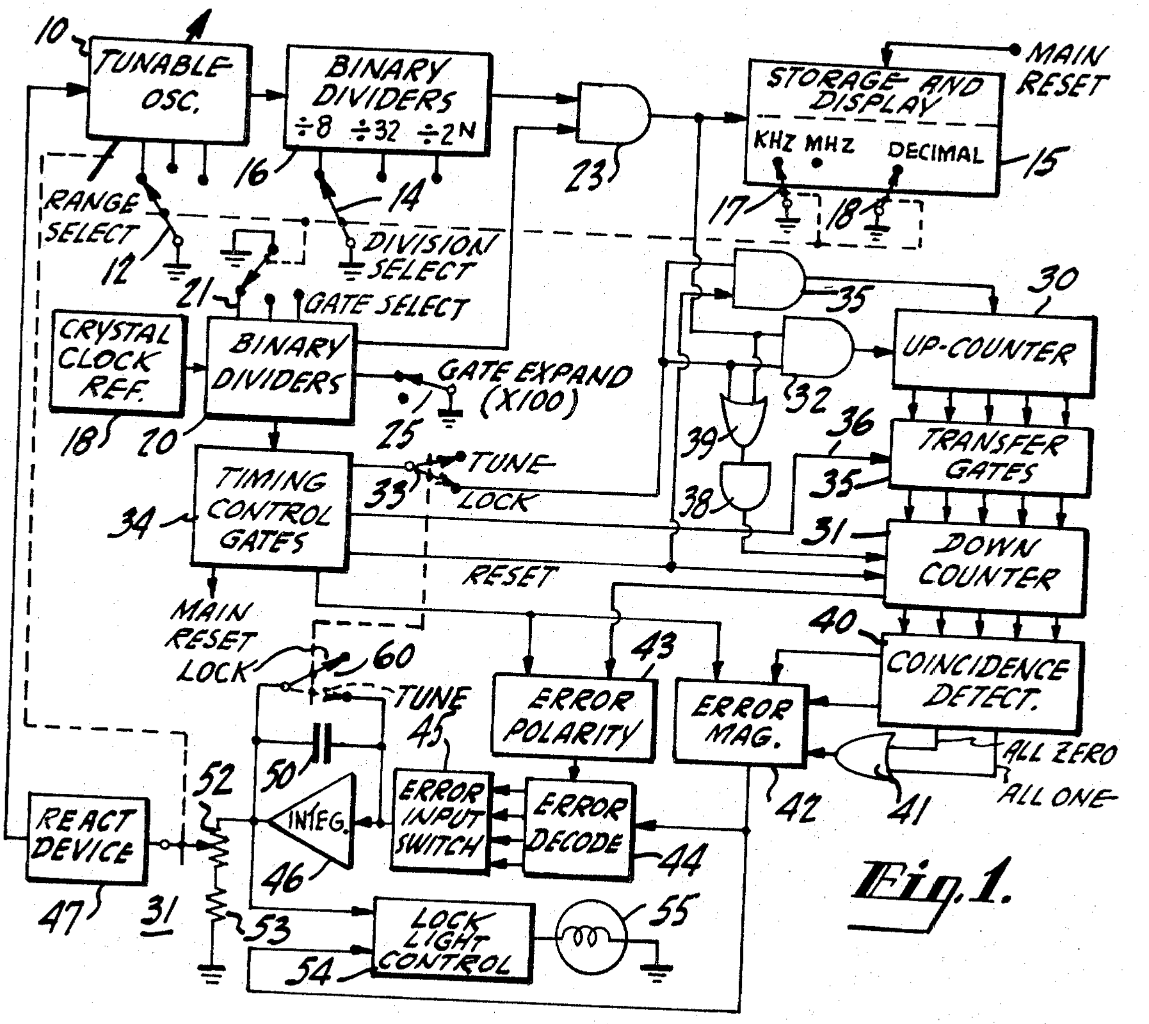
FIG. 1 is a block diagram of a generator and a control system according to this invention.

Referring to FIG. 1, there is shown a tunable oscillator 10. Oscillator 10 may be tunable over an octave, or more, and may be range switched to provide a plurality of frequencies over a desired band.

Range switching is accomplished by means of a switch 12. In order to provide an indication of the frequency of the oscillator or signal generator 10, a related or the actual frequency is counted and displayed by means of a binary type counter or storage counter associated with a display module 15. In order to accomplish counting economically and accurately, the oscillator 10 frequency output is divided by a programmable or preselectable binary divider module 16. The exact division ratio selected is a function of the frequency band or range desired and is so selected by switch 14. The switch 14 is mechanically or electrically ganged to switch 12, which thereby automatically selects the correct division ratio for the binary divider module 16.

Therefore, dependent upon the setting of switches 12 and 14, the binary divider 16 will provide at its output the oscillator frequency divided by 8, 32 or some other binary divisor generally represented by $2^n$.

In order to assure correct frequency reading, a crystal reference oscillator 18 is utilized. The oscillator 18 includes a crystal or some other accurate frequency determining means to provide at the output thereof a stable frequency reference. This reference is then divided by means of binary dividers 20. The division ratio is again controlled by a switch 21 or other means responsive to the settings of switches 12 and 14 to thereby provide a gate of a duration to enable the storage and display module 15 to store and display a number directly related to the actual frequency of the oscillator 10.

Accordingly, a gate 23 has one input supplied from the binary dividers 16 and another input supplied from the binary dividers 20. In this manner, the number of pulses introduced into the storage and display module 15 is always representative of the frequency of the oscillator 10. Also shown coupled to the storage and display module 15 are two switches 17 and 28, also ganged or coupled to switches 12, 14 and 21 and provided to control the frequency indication as kilohertz or megahertz and the decimal point location.

Although the gate 23 is shown as following the binary dividers 16, it is perfectly obvious and may actually be desirable to place the gate 23 and the timing input thereto from dividers 20, prior to the binary divider 16.

In this manner, gate 23 will feed the divider 16 directly. The output of the dividers 16 will then be applied directly to the storage and display module 15. In any event, the operation of the control system to be described is the same.

The general nature and operation of such generators and display devices can be had by reference to the above-noted patent, U.S. Pat. No. 3,509,484.

In any event, such generators and displays do not, for economical and other reasons, display the total number of actual digits representative of the oscillator 10 frequency.

For example, assume the oscillator 10 was set at 4,001,686Hz or 4.001686MHz. In this case, the display might indicate this frequency to only four places, as 4.001MHz. For most purposes, this may be sufficient.

However, if the operator activates switch 25, the counter time base as generated by the dividers 20 is divided by a factor of 100. This thereby increases that count gate's duration, as selected by switch 21, 100 times. Therefore, the four digit display at the end of the extended period is shifted two places to the left and the storage and display 15 would indicate 0168.

The operator would then know the frequency to be at least 4.00168MHz. As indicated, for many test procedures, this type of accuracy may be desired. Furthermore, it would also be desirable to impart to the oscillator 10 a frequency stability, for such critical tests, of the order of magnitude of that provided by the crystal reference source 18.

In order to lock or synchronize the oscillator 10, there is provided an up-counter 30 and a down-counter 31. An up-counter 30 is an ordinary binary or decimal counter, as is well known, and increases a count stored therein by one for each pulse applied thereto. A down-counter 31, as is well known, actually decreases its count by one for each pulse applied thereto. Many examples of up and down-counters exist in the prior art and many such types could be used for the modules 30 and 31 as described herein.

The up-counter 30, as indicated, may be of a binary type and, in essence, consists of a chain of bistable multivibrators arranged in a counter configuration. The up-counter 30 is activated to count by means of an AND gate 32. AND gate 32 has one input coupled to gate 23 and one input coupled through a TUNE-LOCK switch 33 to the timing and control gate module 34 associated with the crystal clock binary divider module 20. The exact nature of the control signal applied to the AND gate 32 will be described subsequently.

A reset gate 37 is associated with the up-counter 30 and is used to reset the same to an all zero or start position. The reset gate 37 has one input coupled to a reset line derived from the timing control gates 34 and another input coupled to the TUNE-LOCK switch 33.

Between the up-counter 30 and the down-counter 31 are a series of transfer gates 35. There is one transfer gate for each multivibrator stage in the up and down-counters 30 and 31. That is, if the up-counter 30 included six multivibrators, the down-counter 31 would also include six multivibrators. There would then be provided six transfer gates 35. Each gate could be a dual input gate. One input is activated by the corresponding and associated multivibrator and the other input would be strobed or pulsed by a suitable clock, as will be described, to enable these gates to transfer the binary information from the up-counter 30 to the down-counter 31. The strobe clock is provided by the timing control gates on lead 36 coupling the timing control gate module 34 to the transfer gates 35.

The down-counter 31 has associated therewith an "AND" gate 38. The input of gate 38 is supplied via an inverter 39 having an input terminal coupled to the output terminal of gate 23.

The outputs of the binary stages of down-counter 31 are coupled to a coincidence detector 40, which functions to detect the count or the status of the down-counter 31 at the end of a lock cycle as will be described. The output of the coincidence detector 40 is coupled via an "OR" gate 41 to an Error Magnitude Selector Module 42. Another input to the Error Magnitude Selector 42 is furnished by the timing control gates 34. The Error Magnitude Detector has other inputs applied thereto from the coincidence detector 40 as will be explained.

The function of module 42 is to determine the extent of control necessary for the oscillator 10. An Error Polarity Detector 43 has one input coupled to the down-counter 31 and another input controlled by the timing control gates 34 and functions to determine whether a positive or negative control mode is necessary.

The outputs of the Error Magnitude Detector 42 and the Error Polarity Detector 43 are applied to an Error Decode Module 44.

The function of decode module 44 is to respond to the polarity and magnitude of the error and provided by modules 43 and 42 to provide suitable control signals to the error input switches 45.

The error input switches 45 apply the control signal to an integrator circuit 46.

The integrator 46 takes the error signal and integrates it to provide a control signal which is applied to a variable reactance device 47.

The variable reactance device 47 may be a varactor diode whose reactance or, for the varactor, capacitance varies according to the magnitude of an applied signal. The variable reactance device 47 is coupled to the oscillator 10 in a manner to control the resonant frequency thereof, as to raise or lower the same. Such reactance control devices and the manner of coupling them to oscillator circuits are well known.

The integrator 46 is conventionally shown as an operational amplifier with a feedback or integrating capacitor 50 coupled from input to output. Such integrators using high gain operational amplifiers are also well known in the art. The capacitor 50 is shorted by a switch 60 which is mechanically ganged to switch 33. Switch 60 serves to short out the capacitor during a tuning mode, to enable tuning without frequency control.

The output of the integrator is coupled to an attenuator 51. As shown, the attenuator 51 comprises two resistors 52 and 53. Resistor 52 is shown as a potentiometer having the variable arm thereof coupled to reactance element 47.

A dotted line, as will be explained, indicates that the arm of potentiometer 52 is controlled by the tuning control, represented by an arrow, associated with the tunable oscillator 10.

A lock light control circuit 54 has one input coupled to the output of the integrator 46 and another input coupled to the output of the error magnitude detector 42. The lock light control circuit 54 energizes a lamp 55 during the lock mode as will be explained.

THEORY OF OPERATION

For simplicity of explanation, assume that the oscillator 10 is tuned to a frequency of 4.00MHz or 4,000,000 cycles. This would correspond to switch 12 set at the range which includes 4.00MHz. The binary divider 16 would be set to divide by 8 via switch 14 ganged to switch 12. The gate select switch 21 then would cause a count-gate of 8 milliseconds or $8 \times 10^{-3}$ seconds to be provided.

Therefore, the output of binary divider 16 would be 4.0MHz divided by 8 or 500,000Hz. This frequency would be applied to the appropriate input of gate 23. The other input of gate 23 would be enabled for $8 \times 10^{-3}$ seconds. The output of gate 23 would therefore provide $500,000 \times 8 \times 10^{-3}$ or 4,000 pulses. The storage and display 15 would then count 4,000 pulses during the 8 millisecond interval and therefore would indicate 4.000MHz due to the setting of the ganged switches 17 and 28. During this tuning mode, as the variable oscillator 10 is moved in frequency, the TUNE-LOCK switches 33 and 60 are in the Tune position and hence the integrator 46 is disabled.

With switch 33 in the Tune position, AND gate 32 is enabled and causes the up-counter 30 to count the pulses at gate 23 for each counting cycle. Therefore, at the end of each count period, the up-counter 30 and the storage and display module 15 has the frequency count stored therein. When the TUNE-LOCK switch 33 is closed or placed in the Lock position, switch 33 disables AND gate 32 and Reset gate 37 after the termination of the count gate. Therefore, the up-counter 30 has stored therein the last number corresponding to the oscillator's 10 frequency.

At the end of the main count cycle, the contents of the up-counter 30 are strobed into the down-counter 31 by means of the transfer gate 35. The down-counter gate 39 is then enabled after a transfer of the number stored in up-counter 30. This action may be provided by the same signal used for inactivating the up-counter gate 32.

Therefore, during the new main count cycle, the down-counter begins to count down from the frequency or number transferred to it.

Because the down-counter 31 has the same number of bits as the up-counter 30 and because the exact interval is used to count up and down; if the oscillator frequency did not change, the down-counter 31 would read zero at the end of this interval.

This is so as the same frequency has been counted up and down for the same time interval. However, if the oscillator drifted from the initial setting as stored and retained by the up-counter 30, the output of the down-counter 31 will indicate a difference from the count transferred by the up-counter 30. Therefore, by sensing the output of the down-counter 31 and generating the appropriate signal, the oscillator 10 can be controlled in frequency so that the frequency is stabilized.

This is accomplished as follows. As indicated, if the oscillator 10 did not drift, at the end of the count interval the coincidence detector 40 would detect the all zero state in the down-counter 31. The error magnitude and polarity circuits 42 and 43 are strobed at this time and the "OR" gate 41 indicates the all zero condition, which means that the frequency of the oscillator 10 did not drift, as the same number of pulses originally stored were counted down to zero during the exact interval.

Before further explanation of the control process, the nature of the oscillator control signals and how they are derived will be given.

As noted from the diagram, there are four leads emanating from the error decode module 44 and as applied to the error input switches 45. Essentially, there are four control conditions provided by the circuitry shown. These may be indicated as follows:

1. SLOW-POSITIVE CONTROL,
2. FAST-POSITIVE CONTROL,
3. SLOW-NEGATIVE CONTROL,
4. FAST-NEGATIVE CONTROL.

Basically, an oscillator as 10 may drift low or high in frequency or positive or negative with respect to a desired value.

The drift may be large or fast or rather small or slow. For example, the oscillator may only drift 10 cycles in a given interval as compared to 100 cycles. The 10 cycles drift is slow compared to the 100 cycles drift. The drift may be above the desired frequency or below the desired frequency during the interval.

Therefore, in order to perform correction, one must know the rate of the drift (slow or fast) and the direction of the drift (positive or negative) or the direction to control the oscillator. This information is readily available and can be obtained by simple digital circuitry as will now be explained.

First, let us explain the nature and operating characteristics of a down-counter 31.

As indicated, the down-counter 31 receives the stored count from the up-counter 30 via the transfer gates 35 only after the TUNE-LOCK switches are set to the Lock position. Assume this count to be 5555.

If during the same count interval exactly 5555 pulses are down counted by counter 31, the coincidence detector 40 will detect the all zero state and indicate the same via "OR" gate 41 to the error magnitude detector 42. The polarity of the error is zero as neither a positive or negative frequency drift occurred. This information is available from the gate 41 (via all zero input). Hence, the error decode 44 supplies a zero control voltage signal on either the slow positive or slow negative lead. This condition may cause no switching of the error input switches 45 and hence the integrator 46 continues to supply a quiescent voltage to the variable reactance devices 47 associated with the oscillator 10. That action thus maintains that frequency which causes 5555 pulses to appear at the output of gate 38.

Now assume that the frequency of the oscillator decreased so that 5554 pulses were applied to the down-counter 31 during the same interval. At the end of the interval, the down-counter would have a "one" remaining in the least significant place (i.e., 5555−5554 = 1). The three most significant integers would be zero, as the actual number remaining in the down-counter 31 is 0001. Hence, detection of the most significant stage indicates that the new frequency of the oscillator is lower than it was previously. This is so as 5554 is less than 5555 and the last stage has been set to zero during the down count.

Hence, the polarity detector 43 which monitors this digit detects the zero state of the most significant integer and indicates a positive control mode condition. This then means that the error decade 44 is to supply a voltage to increase the frequency of the oscillator 10.

Since the down-counter "was almost" reset (i.e., it is at 001.), this means that the condition of the oscillator or the offset was "small" (one cycle). This condition can be detected in a number of ways which should be obvious to one skilled in the art. For example, the three most significant digits of the down-counter could be sensed by an "AND" gate to determine the all zero state of these three stages. This, in essence, indicates that the drift in the oscillator caused gate 38 to provide from one-nine pulses (1 to 9) less than necessary, in the case of a cascaded decade counter, or one pulse less in the case of a binary type.

This information is fed to the Error Magnitude Detector 42 indicating that the oscillator offset is small. Hence, the information from the Polarity Detector 43 indicates to the error decode module 44 that the control condition is a slow positive control. This is a two bit binary signal, as a 00, thus stating that the error decode 44 is to provide a control signal which will increase the oscillator frequency by a small amount in the positive direction.

The error input switches 45 are, for example, four "AND" gates which respond to the four different binary states supplied by the error decode module 44. One "AND" gate responsive to the 00 stage is activated and causes a small d.c. to be applied to the integrator 46. This d.c. step or transition is integrated to form a "-slow" varying ramp which ramp is applied to the reactance device 47 and of a polarity to decrease its capacity and hence raise the oscillator's 10 frequency.

The next control cycle begins. The same number as stored originally in the up-counter 30 is again transferred to the down-counter 40. The raised oscillator frequency is again divided by dividers 16 and applied to the down-counter 31 via gates 23, 39 and 38.

Now assume that the frequency of the oscillator has drifted higher so that gate 38 now supplies 5556 pulses to the down-counter 31 during the timing interval.

This, therefore, causes the down-counter 31 to be set to zero at the 5,555th pulse, the next pulse or the 5,556th pulse changes the entire down-counter from all zeroes to the "highest possible state".

As it is desired to keep the specification as simple as possible, a brief description of this highest possible state will be given. For example, the down-counter and up-counter 31 and 30 might be a four-stage cascaded decade counter. Each stage of a decade counter consists of four binary multivibrators arranged to count to 10 and recycle. Hence, the up and down-counters may comprise four such decade counters in cascade and therefore capable of counting from 0000 – 9999. Hence, the highest possible state of the down-counter 31 would be 9999.

Alternatively, the counter may be a straight forward binary counter consisting of 11 multivibrators arranged in a binary counting chain. Such an arrangement has a possibility of $2^{12}$ unique counts or 8224 positions. The highest possible state of this counter type will be when all of the eleven flip-flops or multivibrators indicate a binary "1" or 11111111111.

In any event, independent of the counter used, the most significant stages now indicate a 1 or a 9 instead of a zero for just one extra pulse.

Hence, at the end of the interval, this condition is detected again by the error polarity detector 43; and since these last stages of the down-counter 31 are 999 or 111, it is again known that the frequency of the oscillator 10 is wrong, that it is higher than stored originally by the up-counter. This indicates a negative control condition specifying that a decrease in oscillator frequency is desired.

For the "all one" condition, the coincidence error detector 40 senses this and activates "OR" gate 41, which applies this information to the error magnitude detector 42. Again, this indication specifies that the change in frequency was small or slow and hence the polarity detector 43 and the error magnitude detector 42 specify a slow-negative condition. This may be represented by binary number 01.

An "AND" gate in the error input switch 45 responds to this (01) to provide a d.c. to the integrator 46 which will produce a ramp at the output of opposite polarity, as above described, and to be applied to the reactance device 47 in order to lower the frequency of the oscillator 10.

The remaining two modes as fast-positive and fast-negative are indicated as follows.

Fast-Positive Control

Assuming the same initial set-up of 5555 pulses, let us assume that oscillator 10 drifted lower in frequency to cause only 5,500 pulses to be applied to the down-counter 31.

Therefore, at the end of the interval, the count remaining (decimal) is 0055. The error polarity detector 43 would detect the zero in the most significant stage and hence indicate a positive control mode, and therefore, a need to raise or increase the oscillator's frequency. The coincidence detector 40, consisting of a plurality of "AND" gates would sense, for example, that the least two significant stages are not zero; or that the second stage alone is not zero. This indicates that at least 10–99 pulses are missing. The output of the error polarity detector 43 and the error magnitude detector 42 as combined in the error decode 44 indicate a FAST-POSITIVE CONTROL or a binary (10) condition. Thus, an "AND" gate decoding the binary (10) would activate; causing the error input switch 45 to provide a larger d.c. voltage at the input of integrator 46.

This would be integrated to provide a control ramp applied to reactance device 47 to increase the oscillator frequency by a greater amount.

FAST-NEGATIVE CONTROL

Again, assuming the 5555 pulse condition, suppose oscillator 10 increased in frequency to produce 5605 pulses or 50 additional pulses.

Down-counter 31 would reset to zero at the 5555th pulse. The 5556th pulse would set it to its highest possible state (i.e., assume this to be 9999, for a cascaded decade counter). At the end of the interval, the setting of the down-counter would be 9950.

The error polarity detector 43 responds to the nines at the most significant digits and hence indicates a negative control mode. The error magnitude detector 42 as primed by the coincidence detector 40 would detect that the least significant digits (last 2) or the second least significant digit is not zero.

Hence, this condition would indicate a FAST mode. The combination of the error polarity detector 43 and error magnitude detector 42 would therefore indicate a FAST-NEGATIVE CONTROL mode or a binary (11). This activates an error input switch AND gate decading (11) to generate a DC which when integrated provides a control ramp for reactance device 47 which serves to lower the oscillator's frequency.

It is also noted that the attenuator 51 at the output of the integrator 46 is mechanically or otherwise coupled to the oscillator 10 tuning control. In this manner, the magnitude of the control ramp is varied according to the frequency setting or tuning of the oscillator 10 to assure that a constant control loop gain is provided independent of the frequency of the oscillator. In this manner, the control ramp will serve to change the oscillator frequency by a given amount according to the frequency setting of the oscillator 10.

The Lock digit control 54 may be an ordinary "OR" gate circuit and will activate lamp 55 whenever the error magnitude detector 42 indicates an error and/or whenever a control voltage is generated by the integrator 46. Hence, this lamp 55 indicates the frequency control operation.

If the gate expand switch 25 were operated, the operator would immediately see that the least significant places of the oscillator 10 were held stable within a predetermined control range by the above-described control system. To further show the capability of the system, a further analysis of the control range and system capability will be given.

Assume that the frequency of the generator is set to 40,000,000Hz or 40.000MHz by setting oscillator 10 to this frequency. If a five digit display were used in module 15, it would therefore read 40.000MHz.

The selection of this frequency would cause range switch 12 to control switch 14 and set the binary divider 16 for a division by 32. Hence, the output of the binary divider 16 would provide 40,000,000/32 pulses every second, or 1,250,000 pulses per second. The binary divider 20 would be set to provide a clock to gate 23 of 32 milliseconds or $32 \times 10^{-3}$ seconds. Therefore, 40,000 pulses would appear at the output of gate 23 during the 32 millisecond period. The storage and display device 15 would then read or indicate 40.000MHz, at the end of the 32 millisecond period. It is, of course, realized that different binary divisions in conjunction with different clock rates to provide three or four digit readings or alternatively, to provide readings of greater than five digits, may be utilized.

When the TUNE-LOCK switch 33 is actuated, the number indicative of 40.000MHz is stored in the up-counter 30, and remains stored therein until the TUNE-LOCK switch 33 is again placed in the Tune position. At the end of the 32 millisecond period, the down-counter 31 receives this number and the logic described above commences the control operation. Essentially, if a 64 millisecond square wave is used, 32 milliseconds is used for the count-down interval, as this is equal to the count-up interval and 32 milliseconds is used for logic implementations as generating the control ramp, etc.

This, therefore, contemplates a 50 percent sampling period for the control system (i.e., 32 milliseconds for the count and 32 milliseconds for the logic). The sampling rate is determined by the number of sampling periods or logic performing periods available in 1 second. Since the total sequence of counting and logic occurs in about 64 milliseconds, the sampling rate is about 15.6 samples per second. Therefore, the oscillator's frequency of 40.000MHz as divided by 32 is sampled about 15.6 times every second and controlled as many times.

Now assume the oscillator 10 drifted in frequency 1,000 cycles so that the new frequency is 40,001,000Hz or 40.001MHz. A 1,000 cycle drift in regard to a 40 million cycle signal is only 25 parts in a million. However, the prescaler or divider 16 divides the new frequency by 32 to obtain 1,250,031 pulses for down-counter 31. The 32 millisecond time period causes the down-counter gate 38 to receive 4,000.992 pulses.

However, this indicates an instability of one in the last place. Hence, the down-counter may at the end of the interval be set at all zeroes or alternatively set to the "highest possible state" as all "ones" or all nines. Thus, the negative or positive slow control mode is accessed by the logic and the oscillator 10's frequency is lowered or raised slightly, tending to control the same back to 40.000MHz. It can be seen, for this example, that the control signal may never disappear and that the oscillator will be continuously controlled but at a slow rate. However, the oscillator can never drift, for example, beyond this 1,000 cycle deviation. Therefore, the operator will always be sure of the generator's accuracy. Furthermore, it can be seen that for lower division rates and greater length counting chains for the up and down-counters, closer accuracy can be maintained.

Figure 2:
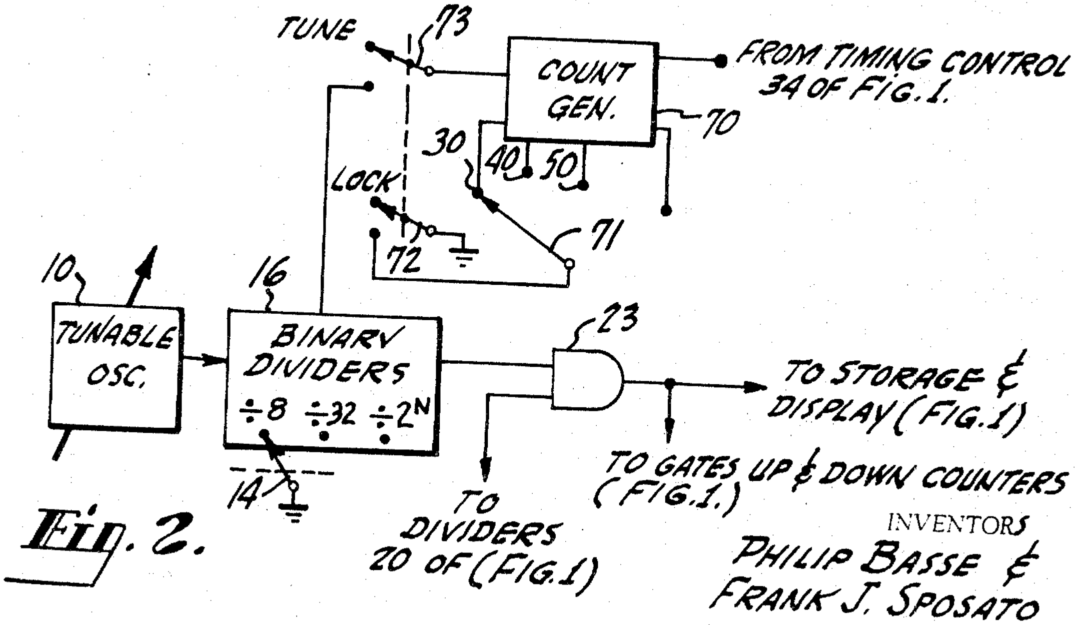
FIG. 2 is a block diagram of a portion of the control system of FIG. 1 showing means for introducing a predetermined error signal into said system.

FIG. 2 shows means for injecting a preset number of pulses into the binary dividers 16 of FIG. 1 to purposely cause a fixed offset to thereby introduce a predetermined error into the control system. The same reference numerals have been retained to represent similar performing configurations.

Essentially, as above-described, the number of pulses emanating from the prescaler 16 determines, during the Lock Mode, the oscillator drift and therefore the system control afforded.

For the above description, it was shown that a true drift in oscillator frequency of 1,000 cycles caused a control mode to be sensed by the logic. This drift of 1,000 cycles was, of course, divided by 32 and resulted in an increase or about 31 extra pulses from prescaler 16.

Alternatively, if the oscillator 10 were stable and one caused 31 or 30 extra pulses, or any reasonable number of additional pulses, to be pre-inserted into the dividers 16, the effective oscillator frequency would appear to have changed. Hence, the output of the down-counter 31 would always provide a control condition to thereby effect the frequency of oscillator 10.

FIG. 2 shows a count generator 70, which can produce a given number of pulses to be injected into dividers 16 to add to the number of pulses normally provided thereby. The count generator 70, as shown, can only be caused to do so during the Lock mode so during the Lock mode via switches 71, 72 and 73, which may be electronic gates or actual wafer switch sections ganged to the TUNE-LOCK switches 33 and so on of FIG. 1. As shown, in the Lock position, a ground is provided for switch 71 to enable the proper number of pulses to be selected, while switch 73 can apply the selected pulses to the dividers 16 by connecting the output of the count generator 70 to an input of dividers 16. The insertion of the pulses is also under control of the overall timing control 34 of FIG. 1.

Generators as 70 for providing any number of pulses for any given duration are known in the art and are not considered part of this invention.

Otherwise, one may also preset the down-counter 31 at a given state to cause it to provide the error directly as well. The alternatives for presetting an error into the above-described control system are many and deemed to be within the technical capabilities of one skilled in the state of the art.

Figure 3:
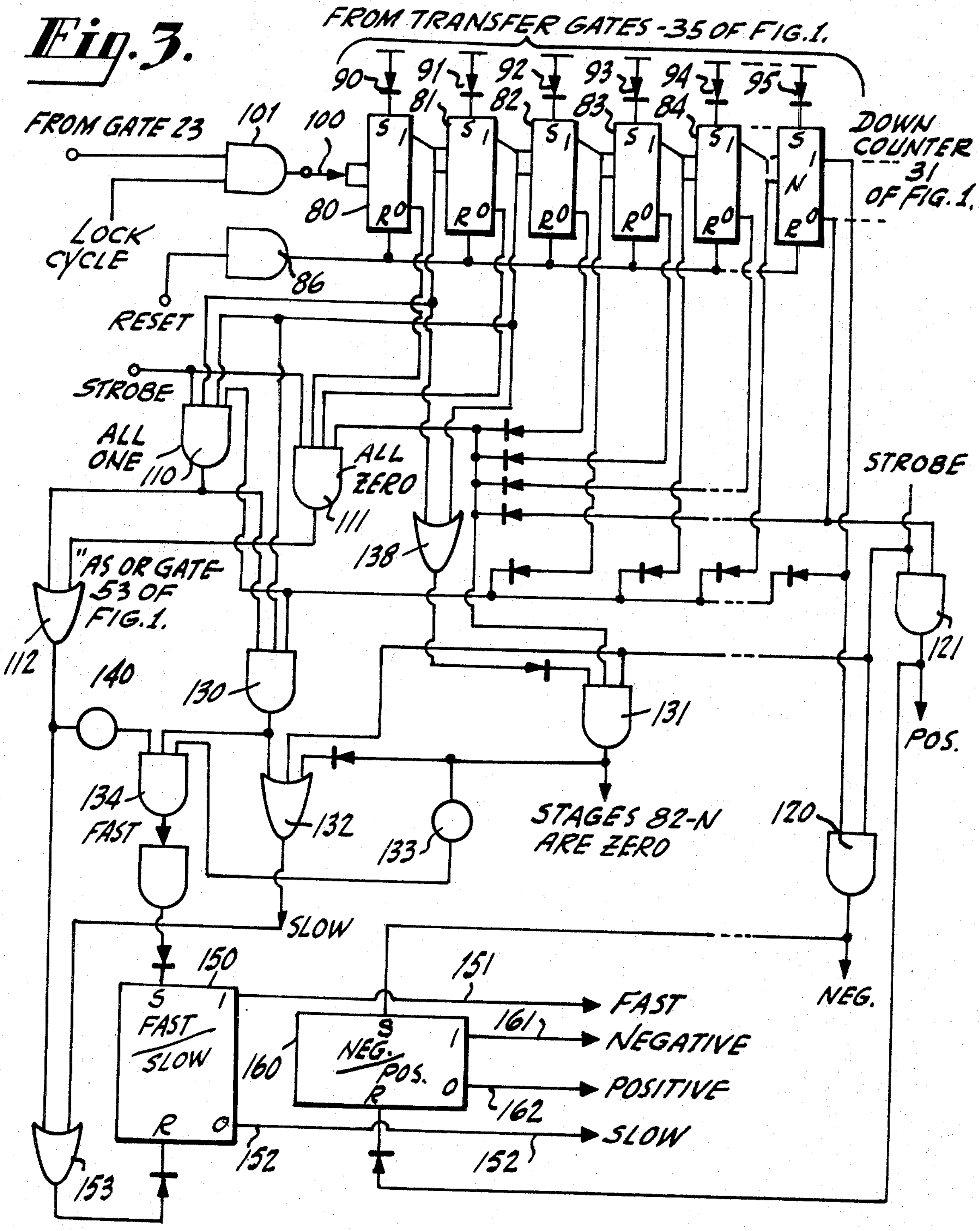
FIG. 3 is a schematic diagram in block form of a portion of the error detection apparatus according to said invention.

FIG. 3 shows in block form the down-counter and associated control circuits in further detail.

A down-counter 31 is, for the sake of simplicity, shown as a plurality of cascaded binary stages 80, 81, 82, 83, 84 and N. As indicated previously, the configuration of the down-counter 31 (FIG. 1) may be of the cascaded decade type or a binary type as shown and may comprise as many stages as desired, and therefore the last stage is generally indicated as N to emphasize this fact. It being only desirable that the up and down-counters correspond in configuration and are compatible in the capability of storing the same length numbers or binary codes.

Before commencement of the Lock cycles, the down-counter 31 (FIG. 1) is reset to all zeroes by means of the common reset gate 86, under control of the timing control gates 34.

The transfer gates 35 are actuated and serve to transfer the count stored in the up-counter 30 to the down-counter 31 via the steering diodes 90–95. Hence, the number stored in the up-counter 30 as representative of the pre-scaled or pre-divided oscillator frequency is set in the down-counter 31 during the strobe interval.

The down-counter 31 is now enabled to down count from this stored number according to the number of pulses applied to the input 100 via the gate 101. This gate is analogous to gate 38 of FIG. 1. It is noted, as indicated previously, that the Lock cycle input is controlled, of course, to ascertain that this gate be activated only during the Lock position of the TUNE-LOCK switch settings. The down-counter proceeds to down count for the exact interval as originally applied to the up-counter 31 to initially store the numerical representation of the oscillator frequency therein. At the end of the interval, the following gates are strobed or sampled simultaneously.

Gates 110 and 111

These gates are the ALL ONE and ALL ZERO gates respectively.

They are conveniently shown as multiple input "AND" gates or coincidence gates. Gate 111 can detect the all zero condition of the down-counter, thus indicating a match and therefore a slow control mode. Alternatively, depending upon the system requirements, a gate as 110, as previously indicated, may not provide a control signal at all and thus cause the integrator 46 of FIG. 1 to remain at its quiescent state.

Gate 110 detects the all one state, as in the case of the binary type counter shown, which is the highest possible state. This, as described, also indicates a slow control mode requiring a lowering of oscillator frequency.

Gates 110 and 111 are applied to an "OR" gate which functions as OR gate 53 of FIG. 1. Thus, if the down-counter 31 is at all zero or all ones at the end of the down count interval, gate 110 or 111 will cause gate 112 to exhibit a high state.

Gates 120 and 121

These gates are the negative and positive control mode gates. They function to determine whether the oscillator frequency increased or decreased at the termination of the down count interval.

For example, if the oscillator frequency increased, then the last stage N of the down-counter 31 would have been returned to a one or a high state after the all zero state. Gate 120 detects this one state and therefore provides at an output the indication that the oscillator frequency is high and that a negative control mode is necessary. On the other hand, if the frequency decreased, the last stage would be zero as a complete down count would not be afforded, but as indicated, a relatively small count would remain. Therefore, gate 121 senses the "one" or high level at stage N and indicates a positive control mode, specifying that an increase in oscillator frequency is required.

Gates 130, 131, 132, 133 and 134

These gates function to detect whether a fast or slow control mode is necessary in regard to preselected design considerations associated with the overall system performance. For example, gate 130 is shown as an "AND" gate. The gate 130 will be activated when all the stages of the down counter are at "one" except the least significant stage. This is afforded as well because of the coupling between gate 110 and an input to gate 130, that "all" the stages are not "one". This states that the count is one cycle off. Of course, the gate 130 can be wired to determine a two cycle difference or a three cycle difference and so on, by proper wiring, and by system considerations. It is understood that the format explained and presented is for illustrative purposes only.

Gate 131 is an "AND" gate which is wired so as to indicate that all the down counter stages above a preselected one or more are at zero. For example, gate 131 as shown will indicate that counter stages 82–N are all at zero and that either or both stages 80 and 81 are not at zero via "OR" gate 138. This again indicates a slow mode. Again, it can be seen that gate 131 can be prewired to provide some other conditions for the slow mode to encompass a wider or smaller range.

If neither gate 130 nor 131 is high during the strobe period, and gates 110 and 111 are not activated, then by definition a FAST MODE exists.

Gate 134 indicates the fast mode by detecting that gate 130 is low, gate 131 is low and gates 110 and 111 are low. During the strobe, this means that there is a count remaining in the down counter which is representative of a larger frequency charge and hence a fast mode.

Gate 132 serves to "OR" the slow mode conditions. Two flip-flops or bistable multivibrators are shown as 150 and 160 and are designated respectively as the FAST/SLOW FLIP-FLOP 150 and the NEGATIVE/POSITIVE FLIP-FLOP 160.

Hence if gate 134 is high, flip-flop 150 is set to the fast state and a high appears on the fast lead 151. If either gate 112 or gate 132 is high, gate 153 is activated and flip-flop 150 is reset and hence a high appears on the "0" line 152 of flip-flop 150 indicating a slow mode. Similarly, if gate 121 is high, flip-flop 160 is set and a high appears on lead 162 indicating a negative mode. Likewise, if gate 120 is high, a high appears on lead 161 indicating a negative control mode. Thusly, the binary representations of control modes are:

| | BINARY |
|---|---|
| (1) FAST — NEGATIVE | 11 |
| (2) FAST — POSITIVE | 10 |
| (3) SLOW — NEGATIVE | 01 |
| (4) SLOW — POSITIVE | 00 |

These are, of course, those binary levels described in reference to FIG. 1. The above gates are included within the so called coincidence detector 40 of FIG. 1.

In summation, there has been described a frequency control system for an oscillator, which system initially stores a number in a counter, transfers the number to a down counter during a Lock mode and generates control voltages which attempt to set the frequency of the oscillator to that number stored at the beginning of the entire cycle.

Various departures and alternatives will become clear to one skilled in the art as to modification of the system thus described. For example, one can see that the four control modes as explained herein can be extended by additional detecting gates to include more than four modes as FAST, SLOW, MEDIUM and so on modes.

Furthermore, as indicated, different gating arrangements and division ratios may be employed in conjunction with the up and down-counters and overall timing, all operating in accordance with the specifications and characteristics of the generator.

It is also apparent that one may eliminate the up-counter and utilize the storage counter and display device to gate or transfer the number to the down-counter 31, or use a single universal counter as both the up and down-counter.

Such departures and alternatives are all deemed to be encompassed within the scope and bounds of the following claims.

What is claimed is:

1. Apparatus for controlling the frequency of an oscillator, comprising, a. first means coupled to said oscillator and responsive to said frequency for storing a first number therein indicative of the value of said frequency during a predetermined interval, b. second means coupled to said oscillator and responsive to said first number representative of said frequency as stored in said first means, said second means responsive to said frequency for (comparing) counting backward from said stored number (with a second number obtained) during a second interval equal to said predetermined interval whereby any difference in said frequency is determined by said second means, and (and)

c. control means coupled to said oscillator and responsive to said any difference (between said first and second number) to correct the frequency (thereof) of said oscillator in a direction towards said first number.

2. The apparatus according to claim 1, further including, a. means coupled to said second means and responsive to said frequency of said oscillator being controlled by said control means according to said difference for introducing a given error in terms of frequency therein to thereby cause said oscillator to be synchronized within a predetermined limit from said first number.

3. The apparatus according to claim 1, further including, a. means coupled to said first means and responsive to said frequency of said oscillator being controlled by said control means for introducing a given error in terms of frequency therein to thereby cause said oscillator to be synchronized within a predetermined limit from said first number.

4. Apparatus for controlling the frequency of a tunable oscillator, said oscillator being capable of (providing) selecting any one of a plurality of frequencies, each one of which can very from a preselected tuned value during a given period of time, comprising:

a. first counting means responsive to said one selected frequency for storing therein a number indicative of said frequency during a predetermined interval, b. down counting means capable of storing therein any number stored by said first counting means and operative to count down from said number by a given integer for each pulse of a series applied to an input thereof, c. means coupling said first counting means to said down counting means for transferring said number stored in said first counting means to said down counting means, d. means coupled to said input of said down counting means and responsive to said one selected frequency for applying a series of pulses thereto representative of said frequency and for (said) a second interval substantially equal to said predetermined interval, whereby if said selected frequency did not vary, said down counting means would indicate zero at the end of said second interval, e. detector means coupled to said down counting means and responsive to any number stored in said down counting means at the end of said second interval to provide a control signal indicative of the polarity and magnitude of said frequency variation, and f. means coupling said detector means to said oscillator and responsive to said control signal for varying the frequency of said oscillator in a direction to tend to cause said down counting means to indicate zero at the end of said second interval.

5. The apparatus according to claim 4 further comprising, a. a frequency divider responsive to said oscillator frequency for dividing the same by a given integer prior to application of said one selected frequency to said first counting means.

6. The apparatus according to claim 5 further including, a. means coupled to said frequency divider for presetting said divider to a given number prior to the application of said oscillator frequency thereto.

7. The apparatus according to claim 5 wherein said frequency divider is a binary counter.

8. The apparatus according to claim 4 wherein said detector means comprises:

a. first and second binary multivibrators, each having two stable states and capable of being selectively operated to be in any one of said states according to a signal applied to an input thereof, b. said first binary multivibrator having said input coupled to that portion of said down counting means which stores the most significant digits of said number for determining the polarity of said frequency variation, and c. said second binary multivibrators having said input coupled to that portion of said down counting means which stores the least significant digits of said number for determining the magnitude of said frequency variation.

9. The apparatus according to claim 4 wherein said means coupling said detector to said oscillator includes, a. an integrator having an input terminal responsive to said control signal for providing at an output terminal an integrated version of said control signal, and b. a variable reactance device coupling said integrator output terminal to said oscillator for varying the frequency thereof according to said integrated version of said control signal.

10. The apparatus according to claim 9 further comprising, a. a variable attenuator coupling said output terminal of said integrator to a source of reference potential for selectively varying said integrated signal at said output terminal, and b. means for varying said attenuator and therefore said control signal according to said tuning of said oscillator.

11. Apparatus for controling the frequency of an oscillator which frequency can undesirably change over a given period of time comprising:

a. first counting means responsive to said frequency for storing therein a number indicative of the value of said frequency during a given interval, b. down counting means operative to decrease a number stored therein by a given integer for each one pulse of a series of pulses to be applied to an input thereof, c. means coupling said first counting means to said down counting means for transferring said number stored by said first counting means to said down counting means, d. means coupled to said input of said down counting means responsive to said frequency for applying to said input of said down counting means a series of pulses representative of said frequency and for a second interval substantially equal to said given interval, whereby if the frequency of said oscillator remained stable, said down counting means would indicate a zero condition at the end of said (given) second interval, e. an error polarity detector coupled to said down counting means for determining the polarity of said frequency change during said second interval, f. an error magnitude detector coupled to said down counting means for determining the magnitude of said frequency change during said second interval, and go control means coupling said error polarity detector and said error magnitude detector to said oscillator for varying the frequency thereof in a direction to cause said down counting means to indicate zero at the end of said second interval.

12. The apparatus according to claim 11 further comprising, a. a binary divider having an input coupled to said oscillator for dividing the frequency thereof by a preselected integer prior to application of said frequency to said first counting means, and b. means coupled to said binary divider for presetting said divider by a given amount to thereby introduce a given error into said first counting means.

13. Apparatus for controlling the frequency of an oscillator comprising:

a. first means coupled to said oscillator and operative during a first interval to store a number therein representative of the frequency of said oscillator and operative during a second interval substantially equal to said first interval for counting down from said stored number, whereby if said frequency of said oscillator varied during said second interval, said means would provide a numerical indication of said variation at the end of said second interval, b. means coupled to said oscillator and responsive to said numerical indication to vary the frequency of said oscillator in a direction so that said numerical indication approaches zero during said second interval.

14. Apparatus for controlling the frequency of an oscillator, comprising:

a. first means coupled to said oscillator and operative during a first interval to store a number therein indicative of the frequency of said oscillator, and operative during a second interval substantially equal to said first interval for counting down from said stored number, whereby if said frequency of said oscillator varied, said means would have stored therein a count at the end of said second interval indicative of said variation, b. detector means coupled to said first means and responsive to the magnitude of said stored count to provide a control signal determinative of the polarity and magnitude of said frequency variation of said oscillator, and c. control means coupled to said oscillator and responsive to said control signal for varying the frequency of said oscillator at a rate and in a direction to cause said stored count to approach zero during said second interval.

* * * * *